(12) United States Patent
Sato et al.

(10) Patent No.: US 9,190,579 B2
(45) Date of Patent: Nov. 17, 2015

(54) METHOD FOR MANUFACTURING LIGHT EMITTING DEVICE AND LIGHT EMITTING DEVICE

(71) Applicant: NICHIA CORPORATION, Anan-shi (JP)

(72) Inventors: Takashi Sato, Yokohama (JP); Hiroshi Miyairi, Yokohama (JP); Kazunori Watanabe, Yokohama (JP)

(73) Assignee: NICHIA CORPORATION, Anan-Shi (JP)

( * ) Notice: Subject to any disclaimer, the term of this patent is extended or adjusted under 35 U.S.C. 154(b) by 0 days.

(21) Appl. No.: 14/063,756

(22) Filed: Oct. 25, 2013

(65) Prior Publication Data

US 2014/0048834 A1 Feb. 20, 2014

Related U.S. Application Data

(63) Continuation of application No. PCT/JP2012/060582, filed on Apr. 19, 2012.

(30) Foreign Application Priority Data

Apr. 26, 2011 (JP) ................................ 2011-098540

(51) Int. Cl.
*H01L 33/50* (2010.01)
*H01L 33/54* (2010.01)

(52) U.S. Cl.
CPC ............ *H01L 33/502* (2013.01); *H01L 33/505* (2013.01); *H01L 33/508* (2013.01);
(Continued)

(58) Field of Classification Search
CPC ... H01L 33/502; H01L 33/507; H01L 33/504; H01L 33/58; H01L 33/508; H01L 33/505; H01L 33/54
See application file for complete search history.

(56) References Cited

U.S. PATENT DOCUMENTS 5,952,397 A * 9/1999 Fujiki et al. ..................... 522/99
6,917,057 B2 * 7/2005 Stokes et al. ..................... 257/98

(Continued)

FOREIGN PATENT DOCUMENTS

EP 1 179 858 A2 2/2002
JP 2000-228544 A 8/2000

(Continued)

OTHER PUBLICATIONS

International Search Report received in PCT/JP2012/060582 dated Jun. 12, 2012.

(Continued)

*Primary Examiner* — William D Coleman
(74) *Attorney, Agent, or Firm* — Foley & Lardner LLP

(57) ABSTRACT

A method for manufacturing a light emitting device that comprises a light emitting element and a phosphor layer to absorb at least a part of light emitted from the light emitting element to emit a light having a different wavelength from that of the absorbed light comprises a first resin layer forming step of forming a first resin layer with a first resin in which viscosity is adjusted to a first viscosity on a light emitting face of the light emitting element to define a predetermined shape of the phosphor layer; a second resin layer forming step of forming a second resin layer with a second resin containing a phosphor in which viscosity is adjusted to a second viscosity lower than the first viscosity on the first resin layer before curing the first resin layer; and a curing step of curing the first resin layer and the second resin layer.

15 Claims, 4 Drawing Sheets

(52) U.S. Cl.
CPC ...... *H01L 33/54* (2013.01); *H01L 2224/48091* (2013.01); *H01L 2224/73265* (2013.01); *H01L 2224/8592* (2013.01)

(56) References Cited

U.S. PATENT DOCUMENTS

| | | | |
|---|---|---|---|
| 7,923,928 B2 * | 4/2011 | Kasakura et al. | 313/512 |
| 8,188,492 B2 * | 5/2012 | Lee et al. | 257/89 |
| 8,384,101 B2 * | 2/2013 | Tokunaga et al. | 257/98 |
| 8,547,009 B2 * | 10/2013 | Hussell et al. | 313/499 |
| 8,680,550 B2 * | 3/2014 | Kim et al. | 257/98 |
| 2004/0124429 A1 | 7/2004 | Stokes et al. | |
| 2006/0073625 A1 | 4/2006 | Harada | |
| 2007/0096113 A1 | 5/2007 | Inoshita et al. | |
| 2007/0228387 A1 | 10/2007 | Negley et al. | |
| 2010/0044735 A1 * | 2/2010 | Oyamada | 257/98 |
| 2010/0321920 A1 * | 12/2010 | Wu et al. | 362/84 |
| 2011/0204400 A1 * | 8/2011 | Koizumi et al. | 257/98 |

FOREIGN PATENT DOCUMENTS

| | | |
|---|---|---|
| JP | 2007-116131 A | 5/2007 |
| JP | 2009-038315 A | 2/2009 |
| JP | 2009-094351 A | 4/2009 |
| JP | 2011-222628 A | 11/2011 |
| WO | WO-2008/043519 A1 | 4/2008 |

OTHER PUBLICATIONS

Extended European Search Report dated Oct. 9, 2014 issued in Application No. 12777316.6.

* cited by examiner

METHOD FOR MANUFACTURING LIGHT EMITTING DEVICE AND LIGHT EMITTING DEVICE

CROSS REFERENCE TO RELATED APPLICATIONS

This application is a continuation application filed under 35 U.S.C. 111(a) claiming the benefit under 35 U.S.C. §§120 and 365(c) of PCT International Application No. PCT/JP2012/060582 filed on Apr. 19, 2012, which is based upon and claims the benefit of priority of Japanese Application No. 2011-098540 filed on Apr. 26, 2011, the entire contents of which are hereby incorporated by reference in their entireties.

BACKGROUND

The present disclosure relates to a light emitting device applicable to light sources of display devices and lamps, and to a method for manufacturing the same.

Regarding light sources of display devices and lamps, research has been conducted on light emitting devices using semiconductor light emitting elements (hereinafter referred simply to as light emitting elements) such as light emitting diodes (LEDs). Such light emitting devices using light emitting elements have been attracting attention as a novel alternative to conventional light sources such as fluorescent and incandescent lamps. In particular, LEDs are widely expected as a next-generation light source of lamps because of their long life compared to other light sources such as fluorescent and incandescent lamps and because of their light emitting capability with low energy.

Among them, white light emitting devices are expected to attract the greatest demand. One type of such devices known in the art produces white light by using a light emitting element and a phosphor to be excited by it to emit light of the complementary color. Such light emitting devices composed of a light emitting element and a phosphor are manufactured by covering the light emitting element with the phosphor layer, where the position and manufacturing method of the phosphor layer involves various techniques.

For example, for the purpose of reducing uneven color or inaccurate color as well as improving the light extraction efficiency, Patent Document 1 discloses a method of forming a phosphor layer including the steps of curing or half-curing a primary resin, thereafter putting thereon a secondary resin containing a phosphor, and sedimenting the phosphor to form a phosphor layer. In a light emitting device manufacture by such methods, its phosphor is positioned remote from its light emitting element, which is called a remote phosphor structure or technique.

The primary resin is provided for preventing the phosphor from being deposited on a conductive wire, by which the technique of Patent Document 1 is aimed at eliminating uneven color and inaccurate color.

Patent Document 1: JP 2009-94351 A

However the method disclosed in Patent Document 1 does not have a sufficient effect on uneven color, and its product suffers from possible delamination between the primary resin and the secondary resin because of the interface therebetween.

It is an object of embodiments of the present invention to provide a method for manufacturing a light emitting device that has effectively reduced uneven color and offers high reliability of being free from delamination between resins, and to provide the light emitting device.

Regarding the light emitting element of Patent Document 1, the present inventors assumed that the effect on uneven color was insufficient because there was another cause of uneven color besides the phosphor deposited on the conductive wire. Based on this idea, the present inventors intensively studied, and thus made the embodiments of the present invention.

SUMMARY

That is, the method for manufacturing a light emitting device according to an embodiment of the present invention is a method for manufacturing a light emitting device that includes a light emitting element and a phosphor layer to absorb at least a part of light emitted from the light emitting element to emit a light having a different wavelength from that of the absorbed light, the method including the steps of:

a first resin layer forming step of forming a first resin layer with a first resin in which viscosity is adjusted to a first viscosity on a light emitting face of the light emitting element to define a predetermined shape of the phosphor layer;

a second resin layer forming step of forming a second resin layer with a second resin containing a phosphor in which viscosity is adjusted to a second viscosity lower than the first viscosity on the first resin layer before curing the first resin layer; and a curing step of curing the first resin layer and the second resin layer.

According to the above manufacturing method, the first resin layer is allowed to have a curved surface with no edges by virtue of its surface tension, and the second resin layer is formed before curing the first resin. As a result, the phosphor contained in the second resin layer can be formed into a uniform layer on the surface of the first resin while the surface maintains its tackiness.

That is, as disclosed in Patent Document 1, if the secondary resin is formed after curing or half-curing the primary resin, the phosphor sticks less to the primary resin even if the primary resin has a curved surface, since the primary resin has a degraded tackiness due to the curing or half-curing even. As a result, it is difficult to form a uniform phosphor layer.

Further, because the second resin layer is formed before curing the first resin, the delamination between the first resin and the second resin can be prevented.

The method for manufacturing a light emitting device according to an embodiment of the present invention may further include: a first resin viscosity adjusting step of adjusting the first viscosity of the first resin to not less than 80 Pa·s nor more than 550 Pa·s or less; and a second resin viscosity adjusting step of adjusting the second viscosity of the second resin to not more than 120 Pa·s.

In the method for manufacturing a light emitting device according to an embodiment of the present invention, a surface shape of the first resin layer may be defined by a shape of the light emitting element and the first viscosity.

In the method for manufacturing a light emitting device according to an embodiment of the present invention, in the first resin layer forming step, the first resin layer may be formed by putting the first resin on the light emitting face by a drop.

In the first resin layer forming step, the first resin may be put on a plurality of spots of the light emitting face by drops.

In the method for manufacturing a light emitting device according to an embodiment of the present invention, the light emitting device includes a protrusion mount for mounting the light emitting element, and the second resin layer forming step may include the steps of:

a filler containing resin layer forming step of forming the second resin layer that contains a filler around the mount;

a step of forming the second resin layer that contains the phosphor on the first resin layer and the filler containing resin layer; and a step of sedimenting the phosphor that is positioned over the filler in preference to the filler.

The light emitting device according to an embodiment of the present invention is a light emitting device including: a light emitting element; and a phosphor layer that absorbs at least a part of light emitted from the light emitting element to emit light having a different wavelength from that of the absorbed light, wherein a first resin layer is formed on a light emitting face of the light emitting element so that an edge of the first resin layer substantially conform to an edge of the light emitting face and so that an upper surface is a curved surface, and wherein the phosphor layer is formed along with the upper face of the first resin layer.

In the light emitting device according to an embodiment of the present invention having the configuration as described above, the phosphor layer is positioned close to the light emitting face and has a curved surface. As a result, the optical path length in the phosphor layer can be comparatively uniform, and uneven color can thereby be eliminated.

In the light emitting device according to an embodiment of the present invention, the curved surface is defined based on a shape of the light emitting face of the light emitting element and surface tension of the first resin before curing.

As mentioned above, according to embodiments of the present invention, it is possible to provide a light emitting device that has effectively reduced uneven color, and that offers high reliability of being free from delamination between resins.

DETAILED DESCRIPTION

Methods for manufacturing a light emitting device according to embodiments of the present invention will be described below with reference to the accompanying drawings.

First Embodiment

A first embodiment is a method for manufacturing a light emitting device that includes a light emitting element 1 and a phosphor layer 8a to absorb at least a part of light emitted from the light emitting element 1 to emit light of a wavelength different from that of the absorbed light. According to the present manufacturing method, the phosphor layer 8a can be formed in a uniform thickness between a first resin layer 6 and a second resin layer 7.

Figure 1:
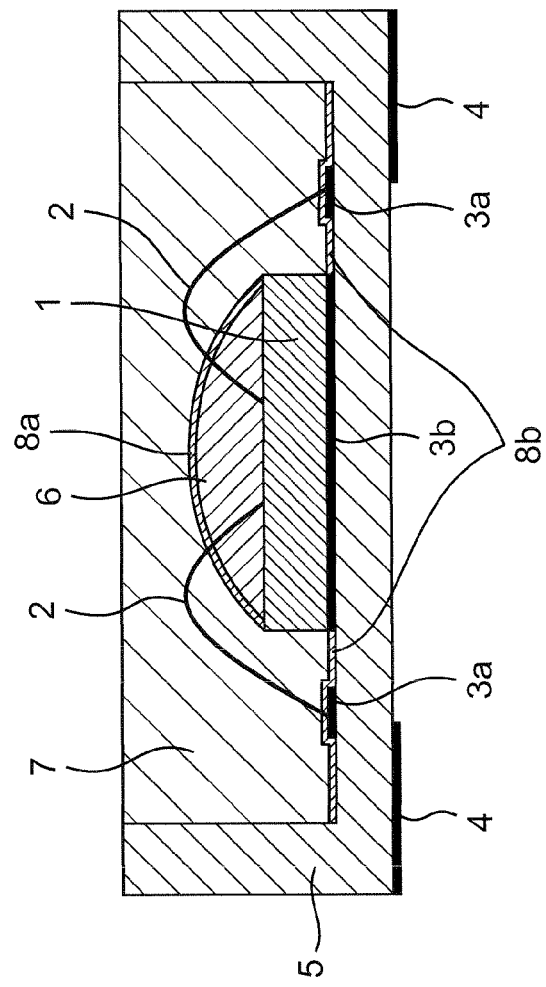
FIG. 1 is a cross-sectional view of a light emitting device manufactured by a method according to a first embodiment of the present invention.

The method for manufacturing a light emitting device according to the first embodiment will be described in detail below with reference to FIG. 2. FIG. 1 is a cross-sectional view of the light emitting device manufactured through the steps illustrated in FIG. 2.

1. Mounting of Light Emitting Element 1 in Package

Figure 2A:
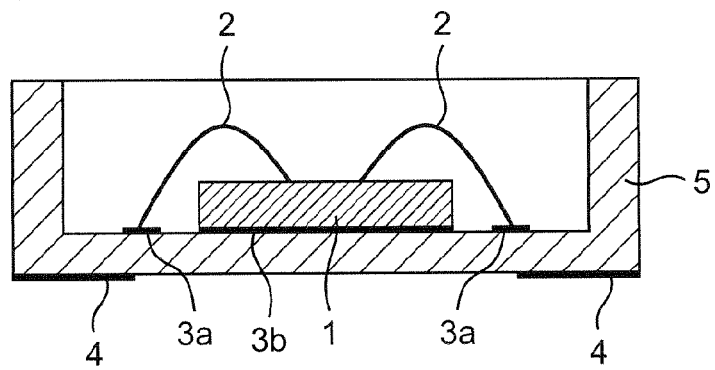
FIG. 2 is cross-sectional views illustrating the respective steps of the method according to the first embodiment of the present invention, FIG. 2A showing a light emitting element mounted on the bottom of a recess of a package, FIG. 2B showing a first resin applied to the light emitting face of the light emitting element, and FIG. 2C showing a second resin mixed with phosphor particles put in the recess of the package.

First, as illustrated in FIG. 2A, the light emitting element 1 is mounted on the bottom of a recess of a package 5 with its light emitting face up. The light emitting element 1 includes, for example, a silicon substrate, and a p-type semiconductor layer, a light emitting layer and a n-type semiconductor layer, all of which are provided on the silicon substrate in this order, and further includes a negative electrode provided on the upper face (light emitting face) of the n-type semiconductor layer. The negative electrode (n electrode) is connected to lead electrodes 3a provided on the bottom of the recess by wires 2. Further, the light emitting element 1 has a positive electrode (p electrode) on the bottom face of the silicon substrate. The positive electrode (p electrode) is connected to a lead electrode 3b provided on the bottom of the recess, for example by a conductive bond. The lead electrode 3a is connected to one external terminal 4, and the lead electrode 3b is connected to the other external terminal 4

While a description was made byway of example employing the wires 2 for connecting the positive and negative electrodes to the lead electrodes 3a, the present invention is not limited thereto, and flip-chip bonding may be employed for connecting them instead.

While a description was made byway of example employing the package 5 with the recess, the present invention is not limited thereto, and may also be applied to a light emitting device including a flat substrate and a light emitting element mounted thereon.

2. Application of First Resin

Figure 2B:
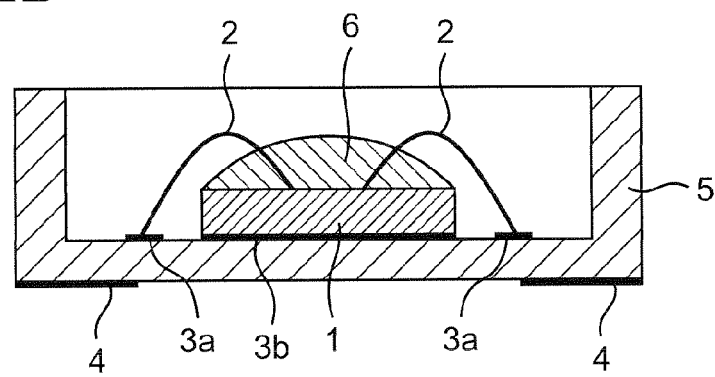

Next, as illustrated in FIG. 2B, first resin adjusted to a predetermined viscosity was applied to the light emitting face of the light emitting element 1, for example by drops (potting).

The viscosity of the first resin is selected in consideration of the shape of the light emitting face of the light emitting element and the surface tension of the resin itself, so that the surface of the first resin layer 6 has a predetermined shape. As used herein, the predetermined shape designates a shape corresponding to a desired shape of the phosphor layer 8a, since the phosphor layer 8a is formed along with the surface of the first resin layer 6 as describe below.

The first resin layer 6 is formed in a curved shape in this way, where it is desirable the diameter or one of the sides d of the bottom face and the height h are selected to satisfy the relationship d>h.

The adjustment of the first resin may be carried out by adding a filler to increase the viscosity or by changing the amount of the filler, as well as by changing the viscosity of the resin itself.

The viscosity of the first resin is suitably selected in consideration of the particle size of the phosphor that is mixed in the second resin described below and the sedimentation time of the phosphor after forming the second resin and before curing the resin. For example, the viscosity may be adjusted to 80 Pa·s or more and 550 Pa·s or less, and preferably 150 Pa·s or more and 200 Pa·s or less.

With the viscosity of the first resin adjusted within this range, the phosphor layer can be easily formed in a uniform thickness, and the particle size and average particle size of the phosphor can be selected from a comparatively easily-adjusted range. Furthermore, the sedimentation time of the phosphor after forming the second resin and before curing the resin can be set comparatively short.

In FIG. 2B, the first resin is put to a single spot at the center of the light emitting face by drops (potting). The present invention is however not limited thereto, and the first resin may be put to a plurality of spots of the light emitting face by drops instead, so that a plurality of projections (each of which has a round top) are formed on the surface for example.

3. Application of Second Resin

Figure 2C:
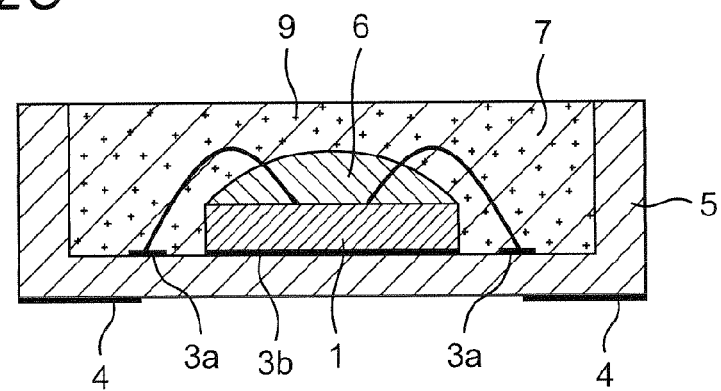

Next, before curing the first resin layer 6, as illustrated in FIG. 2C, a second resin, which is adjusted to a predetermined viscosity and mixed with the phosphor particles, is put in the recess of the package, for example by drops (potting), so that the recess is filled with the resin.

The second resin is mixed with the phosphor particles, and the viscosity thereof is adjusted lower than the first resin so that the mixed phosphor particles can be sedimented easily.

The viscosity of the second resin is suitably selected in consideration of the particle size of the phosphor mixed in the second resin, the sedimentation time of the phosphor after forming the second resin and before curing the resin, and the like. For example, the viscosity may be adjusted to 120 Pa·s or less, and preferably 2 Pa·s or more and 10 Pa·s or less.

With the viscosity of the second resin adjusted within this range, the phosphor layer can be easily formed in a uniform thickness, and the particle size and average particle size of the phosphor can be selected from a comparatively easily-adjustable range. Furthermore, the sedimentation time of the phosphor after forming the second resin and before curing the resin can be set comparatively short.

4. Still Standing (Sedimentation of Phosphor Particles)

Next, the phosphor particles in the second resin are sedimented to form the phosphor layer 8a on the surface of the first resin layer 6.

The sedimentation time of being left standing is suitably selected in consideration of the viscosity of the second resin, the particle size of the phosphor mixed in the second resin and the like. For example, the sedimentation time is set long enough to sediment most of the phosphor particles in the second resin.

The time of being left standing may be shortened, for example by setting the viscosity of the second resin lower, or may be omitted by allowing the sedimentation during a vacant time that inevitably occurs in the production process. Alternatively, the phosphor particles may be forcibly sedimented by applying centrifugal force not so strong as to deform the shape of the first resin in the direction of the normal to the light emitting element (downward, sedimentation direction).

5. Curing

Lastly, the first resin and the second resin are cured.

With the above-mentioned method for manufacturing a light emitting device according to the first embodiment of the present invention, it is possible to manufacture a light emitting device that has effectively reduced uneven color and that offers high reliability of being free from interlayer delamination between the first resin layer 6 and the second resin layer 7.

That is, the light emitting device manufactured by the method of the first embodiment includes the light emitting element 1 having a curved surface defined by its surface tension of a first resin, and the phosphor layer formed thereon. As a result, the light emitted from the light emitting element passes through an optical path having a comparatively uniform length in the phosphor layer (i.e. the optical path difference can be substantially eliminated), and uneven color can thereby be eliminated.

In the manufacturing method of the first embodiment, the filling with the second resin and the sedimentation of the phosphor are carried out before curing the first resin. As a result, the surface of the first resin maintains its tackiness while the phosphor particles are uniformly deposited thereon, which makes it possible to form the phosphor layer having a uniform thickness.

Further, in the manufacturing method of the first embodiment, the first resin layer 1 is formed on the light emitting face of the light emitting element by utilizing the surface tension of the first resin. As a result, the phosphor layer 8a can be formed near the light emitting face, and uneven color caused by the light distribution property of the light emitting element can thereby be eliminated.

Further, in the manufacturing method of the first embodiment, the second resin is formed before curing the first resin. As a result, the interlayer delamination between the first resin layer 6 and the second resin layer 7 can be prevented, which can improve the reliability of the light emitting device. If the first resin and second resin have the same composition except for their viscosities, interlayer delamination can be prevented more effectively.

Hereinafter, examples of the light emitting element and the resins that are employed in the present invention will be described.

(Package and Substrate)

The package has the recess to house the light emitting element, supports the two electrodes and is configured to protect the light emitting element. The package is a molded product molded integrally with the electrodes. It is preferred that the package has a rectangular or near-rectangular shape. It is however not limited thereto, and the package may have a triangular, polygonal or other similar shape. Further, instead of the package with the recess, the light emitting device may include a flat substrate and the light emitting element mounted thereon.

Preferred materials of the package or base are insulative materials and materials that are less transmissive to the light from the light emitting element or external light. Thermoset resins, thermoplastic resins and the like may be employed as long as they have considerably strength. Specifically, examples of such resins include phenolic resins, glass epoxy resins, BT resin (bismaleimide-triazine resin), PPA (polyphthalamide resin) and the like. In particular, triazine-modified epoxy resin, which is one of thermoset resins, is preferred. As for the other thermoset resins, it is preferred to use at least one resin selected from the group consisting of epoxy resins, modified epoxy resins, silicone resins, modified silicone resins, acrylate resins and urethane resins. These thermoset resins and thermoplastic resins may contain an acid anhydride, an antioxidant, a mold release, a light reflecting material, an inorganic filler, a curing catalyst, a light stabilizer, a lubricant, a pigment and the like. Such a light reflecting material may be made of titanium dioxide, silica or the like. Besides the above materials, the package may also be made of ceramics such as aluminum oxide, aluminum nitride and silicon carbide.

(Light Emitting Element 1)

The light emitting element 1 may be various types of light emitting elements 1, including, for example, a nitride semiconductor light emitting element including a sapphire substrate and a nitride semiconductor ($In_XAl_YGa_{1-X-Y}N$, $0 \leq X$, $0 \leq Y$, $X+Y \leq 1$) laminated thereon and the same nitride semiconductor light emitting element without the sapphire substrate. By using such a nitride semiconductor light emitting element in combination with a YAG phosphor or the like, a white light emitting device can be easily fabricated.

A light emitting element suitable for the present invention includes a substrate and a nitride semiconductor laminated thereon, wherein the nitride semiconductor includes, for example, a p-type semiconductor layer, a light emitting layer and an n-type semiconductor layer, which are laminated in this order. The substrate may be a semiconductor substrate of silicon (Si), Ge, SiC or the like, a single metal substrate or a metal composite substrate of two or more metals that are not solid-soluble to each other or that have low solubility limit. As for single metal substrates, they may be made of Cu. As for composite metal substrates, they may be made of at least one metal selected from high conductive metals such as Ag, Cu, Au and Pt and at least one metal selected from hard metals such as W, Mo, Cr and Ni. If a semiconductor substrate is employed, it may have a function as a circuit element. For example, the substrate may be provided with a Zener diode. As for metal composite substrates, a composite of Cu—W or Cu—Mo is preferred.

One example of a method of forming such a light emitting elements is as follows. A semiconductor laminate is formed by laminating the n-type semiconductor layer, the light emitting layer and the p-type semiconductor layer in this order onto a semiconductor growth substrate such as sapphire substrate, and thereafter the p electrode and a metalized layer are sequentially formed on the surface of the p-type semiconductor layer. Before, after or during this, a substrate metalized layer is formed on the substrate, the substrate is flipped over, and the substrate metalized layer is pasted to the metalized layer of the semiconductor laminate. Subsequently, the semiconductor growth substrate is removed from the semiconductor laminate, and the n electrode is formed on the surface of the n-type semiconductor layer that is exposed by the removal. Then, the element is mounted on the package or base with the substrate down.

This light emitting element emits a large portion of light from the face opposite the mounted face, whereas a nitride semiconductor element having a sapphire substrate and a nitride semiconductor laminated thereon emits light from the side faces of the element as well as the face opposite the mounted face.

Another example of a light emitting element that is formed through removing a sapphire substrate has a structure where a package or base receives direct mount of a semiconductor laminate including an n-type electrode and a p-type electrode. In this example, it is preferred that the face of the package or base to which the light emitting element is mounted has a protrusion toward the light emitting element. This protrusion may also be provided separately as a sub-mount between the light emitting element and the package or base. The height of the protrusion corresponds to the thickness of the above-described substrate.

(Resin)

The first resin and the second resin are translucent resins that are transmissive to the light from the light emitting element. Specifically, such materials include silicone resins, epoxy resins and urea resins. The first resin and the second resin may be any combination of materials as long as the second resin has a lower viscosity. They may also be made of the same material, i.e. the first resin may be silicone resin while the second resin may be silicone resin having a lower viscosity than the first resin.

(Phosphor)

Examples of phosphors include (a) rare earth aluminate phosphors that are mainly activated by a lanthanoid such as Ce, and (b) yellow YAG phosphors represented by the composition formulae $Y_3Al_5O_{12}$:Ce, $(Y_{0.8}Gd_{0.2})_3Al_5O_{12}$:Ce, $Y_3(Al_{0.8}Ga_{0.2})_5O_{12}$:Ce and $(Y, Gd)_3(Al, Ga)_5O_{12}$. Besides these phosphors, phosphors having the same performance, functions and effects may be employed Second Embodiment A light emitting device according to a second embodiment of the present invention is different from the light emitting device of the first embodiment in that it includes a mount 51 provided on the bottom face of a recess of a package 50 for mounting the light emitting element 1 and also includes a resin layer (primary second resin layer) 17 containing a filler provided around the mount 51. The light emitting device of the second embodiment is manufactured as follow.

Figure 3:
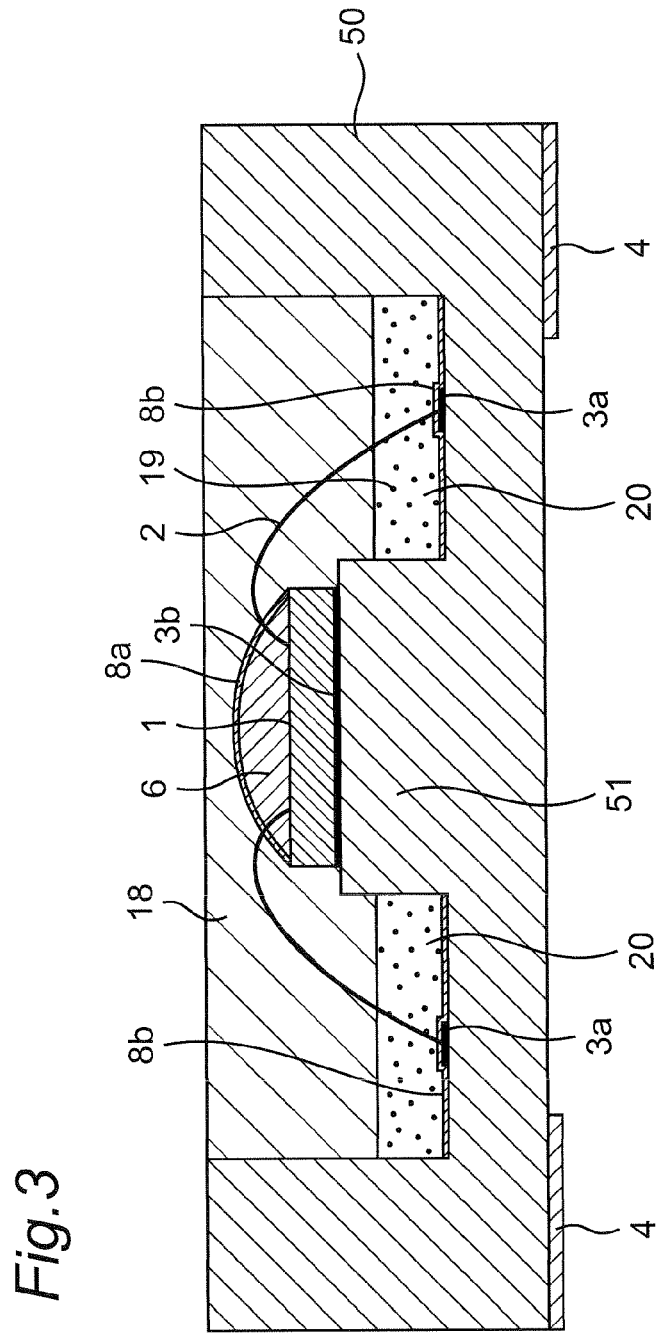
FIG. 3 is a cross-sectional view manufactured by a method according to a second embodiment of the present invention.

Hereinafter, a method for manufacturing alight emitting device of the second embodiment will be described with reference to FIG. 4. FIG. 3 is a cross-sectional view of the light emitting device that is manufactured through the steps illustrated in FIG. 4.

(Manufacturing Method of Second Embodiment)

Figure 4A:
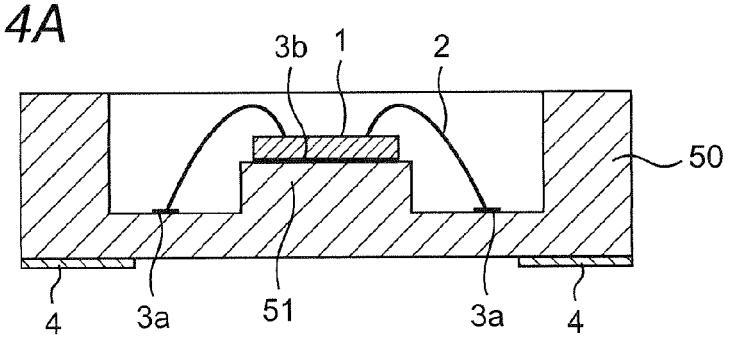
FIG. 4 is cross-sectional views illustrating the respective steps of the method according to the second embodiment of the present invention, FIG. 4A showing a light emitting element mounted on the bottom face of the recess of a package sandwiching a protrusion mount, FIG. 4B showing a primary second resin layer formed around the mount, FIG. 4C showing a first resin layer formed on the light emitting face of the light emitting element, and FIG. 4D showing a secondary second resin layer mixed with phosphor particles put in the recess of the package.

As illustrated in FIG. 4A, the manufacturing method starts with mounting the light emitting element 1 on the bottom face of the recess of the package 50 sandwiching a protrusion mount 51, and connecting wires thereto.

The light emitting element 1 has, for example, the same configuration with the light emitting element of the first embodiment. Its positive electrode on the lower face of a silicon substrate is connected to a lead electrode 3b provided on the mount 51 by a conductive bond, and its negative electrode on a light emitting face is connected to lead electrodes 3a by wires.

Figure 4B:
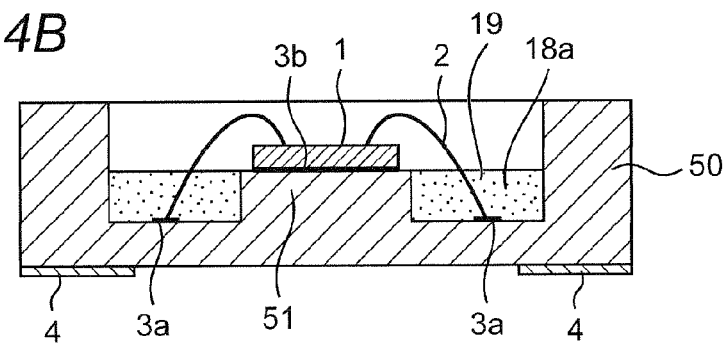

Next, as illustrated in FIG. 4B, a second resin layer 18a (hereinafter also referred to as a primary second resin layer 18a) containing a filler 19 is formed around the mount 51.

Figure 4C:
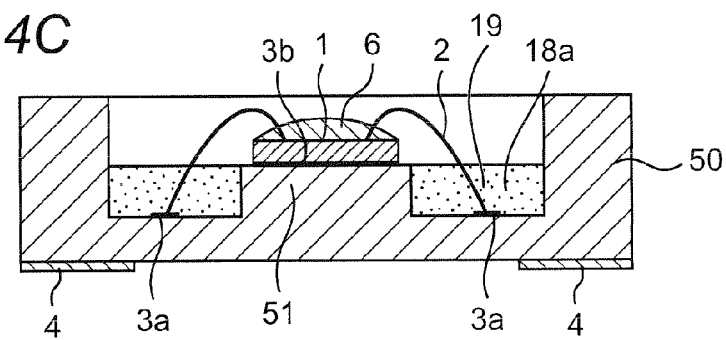

Next, as illustrated in FIG. 4C, a first resin layer 6 is formed on the light emitting face of the light emitting element 1.

Figure 4D:
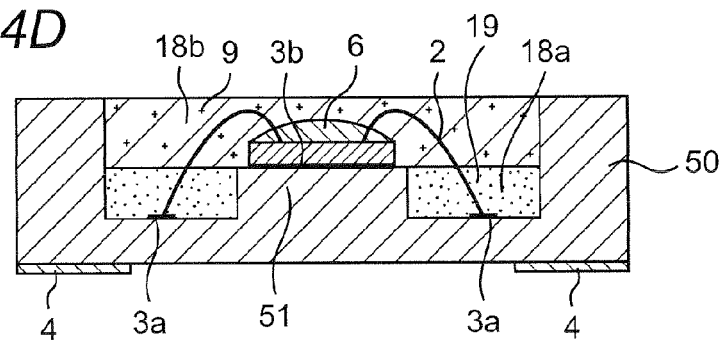

Then, as illustrated in FIG. 4D, a second resin layer 18b (hereinafter also referred to as a secondary second resin layer 18b) mixed with phosphor particles 9 is put in the recess by drops (potting) so that the recess is filled with the resin.

Thereafter, the phosphor particles 9 contained in the secondary second resin layer 18b are sedimented by being left standing (by keeping standing-still for a certain time) to form a phosphor layer 8a on the surface of a the first resin layer 6. Meanwhile, on the bottom of the recess around the mount 51, the phosphor particles 9 are sedimented down below the filler 19 (to the upper face of the body) to form a phosphor layer 8b. On the bottom face of the recess around the mount 51, the phosphor particles 9 can be sedimented down below the filler 19 (to the upper face of the body), because the phosphor particles are accelerated by their own weight while being sedimented (falling) through the secondary second resin layer 18b, and can thereby push away the filler 19 to continue the sedimentation (can be sedimented preferentially) through the primary second resin layer 18a. That is, this process is based on the condition that, in the primary second resin layer 18a, the drag acting on the falling phosphor particles is smaller than the drag acting on the falling filler.

The filler 19 of the primary second resin layer 18a only has to result in being positioned on or above the phosphor 9. For example, it may be sedimented to be a layer on or above the phosphor.

Lastly, the first resin, primary second resin and secondary second resin are cured.

With the manufacturing method as described above, it is possible to manufacture the light emitting device that includes the light emitting element 1 mounted on the protrusion mount 51 formed in the recess of the package 50, the phosphor layer 8a on the surface of the first resin layer 6 that is placed on the light emitting element 1, the phosphor layer 8b around the mount 51, and a filler containing layer 20 provided on the phosphor layer 8b around the mount.

It is preferred that the primary second resin and the secondary second resin are made of the same material such as silicone. They may however be made of different materials as long as they allow the phosphor particles to be sedimented down below the filler (to the upper face of the base) by holding standing-still for a certain time. In the embodiment illustrated in FIGS. 3 and 4, the primary second resin layer 18a and the secondary second resin layer 18b are made of the same material, and they become an integral second resin layer 18 by curing.

The other materials, viscosities and details of the manufacturing method may be the same with those of the first embodiment.

With the manufacturing method of the second embodiment having the above-described configuration and the light emitting device manufactured by the method, it is possible to provide the light emitting device that does not exhibit a yellow ring that occurs when the phosphor layer 8b deposited on the bottom of the recess of the package 50 is irradiated with the light from the light emitting element 1, that has reduced uneven color, and that offers high reliability of being free from delamination between resins. As a result, it is possible to provide the light emitting device that has further reduced uneven color.

Example 1

A light emitting element that includes a silicon substrate, a p electrode, a p-type nitride semiconductor, a light emitting layer, an n-type nitride semiconductor and an n electrode is mounted on a package with a recess. The p electrode, the p-type nitride semiconductor, the light emitting layer, the n-type nitride semiconductor and the n electrode are provided on the silicon substrate in this order. Subsequently, the n electrode is connected to a lead electrode of the package by a wire, and the p electrode is electrically connected to a lead electrode on amount board through the silicon substrate, so that respective electrodes are electrically connected to external terminals positioned on the lower face of the package.

Subsequently, as a first resin, silicone having a viscosity of 180 Pa·s is put on the n-terminal, i.e. a light emitting face of the light emitting element, by potting to form a first resin layer having a curved surface.

Subsequently, as a second resin, silicone containing a phosphor of $(Y_{0.8}Gd_{0.2})_3Al_5O_{12}$:Ce and having a viscosity of 3.5 Pa·s is put on the recess by potting.

By being left for a certain time, the phosphor is sedimented to the surface of the first resin layer to form a phosphor layer having a uniform thickness there. Meanwhile, the remaining phosphor is sedimented to the bottom of the recess.

Lastly, the first resin and the second resin are cured at a temperature for a time high and long enough to cure the first resin and the second resin. The light emitting device is thus obtained.

The light emitting device thus obtained has reduced uneven color and high reliability of being free from delamination between resins.

Example 2

A light emitting element 1 that includes a silicon substrate, a p electrode, a p-type nitride semiconductor, a light emitting layer, an n-type nitride semiconductor and an n electrode is mounted on a package 50 with a recess. The p electrode, the p-type nitride semiconductor, the light emitting layer, the n-type nitride semiconductor and the n electrode are provided on the silicon substrate in this order. In this example, a protrusion mount 51 is provided on the bottom face of the recess, and the light emitting element 1 is mounted on the mount 51. Subsequently, the n electrode is connected to a lead electrode 3a of the package by a wire 2, and the p electrode on the lower face of the silicon substrate is connected to a lead electrode 3b provided on the upper face of the mount 51. Subsequently, as a primary second resin, silicone having a viscosity of 3.5 Pa·s and containing $TiO_2$ as a filler in a proportion of resin:filler=100:33 is put on the bottom face of the recess around the mount to form a filler containing layer, i.e. a primary second resin layer 18a. Subsequently, as a first resin, silicone having a viscosity of 180 Pa·s is put on the n electrode, i.e. the light emitting face of the light emitting element, to form a first resin layer 6 having a curved surface. Subsequently, as a secondary second resin 18b, silicone containing phosphor particles of $(Y_{0.8}Gd_{0.2})_3Al_5O_{12}$:Ce and having a viscosity of 3.5 Pa·s is put in the recess by potting.

By holding standing-still for a certain time (still standing), the phosphor particles are sedimented to the surface of the first resin layer 6 to form a phosphor layer 8a having a uniform thickness. Meanwhile, the remaining phosphor is sedimented to the bottom of the recess below the filler, i.e. to the bottom face of the recess. Lastly, the first resin, the primary second resin, and secondary second resin are cured at a temperature for a time high and long enough to cure the first resin and the second resin. The light emitting element is thus obtained.

The light emitting device thus obtained has reduced yellow ring, and thereby has further reduced uneven color, and offers high reliability of being free from delamination between resins.

The invention claimed is:

1. A method for manufacturing a light emitting device that comprises a light emitting element and a phosphor layer adapted to absorb at least a part of light emitted from the light emitting element and to emit a light having a different wavelength from that of the absorbed light, the method comprising:
 a first resin layer forming step of forming a first resin layer on a light emitting face of the light emitting element, the first resin layer comprising a first resin having a first viscosity;
 a second resin layer forming step of, before curing the first resin layer, forming a second resin layer on the first resin layer, the second resin layer comprising a second resin containing a phosphor, the second resin having a second viscosity that is lower than the first viscosity; and
 a curing step of curing the first resin layer and the second resin layer, wherein the first resin layer includes a surface that defines a shape of the phosphor layer.

2. The method for manufacturing a light emitting device according to claim 1, further comprising:
   a first resin viscosity adjusting step of adjusting the first viscosity of the first resin to not less than 80 Pa·s nor more than 550 Pa·s; and
   a second resin viscosity adjusting step of adjusting the second viscosity of the second resin to not more than 120 Pa·s.

3. The method for manufacturing a light emitting device according to claim 1, wherein a surface shape of the first resin layer is defined by a shape of the light emitting element and the first viscosity.

4. The method for manufacturing a light emitting device according to claim 1, wherein the first resin layer is formed by depositing a drop of the first resin on the light emitting face of the light emitting element in the first resin layer forming step.

5. The method for manufacturing a light emitting device according to claim 1, wherein the first resin is formed by depositing a plurality of drops on a plurality of spots on the light emitting face of the light emitting element in the first resin layer forming step.

6. The method according to claim 1 for manufacturing a light emitting device that further includes a protrusion mount for mounting the light emitting element, the second resin layer forming step comprising:
   a filler containing resin layer forming step of forming the second resin layer that contains a filler around the mount;
   a step of forming the second resin layer that contains the phosphor on the first resin layer and the filler containing resin layer; and
   a step of sedimenting the phosphor that is positioned over the filler in preference to the filler.

7. A light emitting device comprising:
   a light emitting element; and
   a phosphor layer having a phosphor that absorbs at least a part of light emitted from the light emitting element and emits light having a different wavelength from that of the absorbed light,
   wherein a resin layer is formed on a light emitting face of the light emitting element such that a peripheral edge of the resin layer substantially conforms to a peripheral edge of the light emitting face and such that an upper surface of the resin layer is a curved surface, and
   wherein the phosphor layer is formed along the upper surface of the resin layer such that the light emitting element is separated from any phosphor contained in the light emitting device.

8. The light emitting device according to claim 7, wherein the curved surface is defined based on a shape of the light emitting face of the light emitting element and a surface tension of the resin before curing.

9. The light emitting device according to claim 7, further comprising:
   a substrate having a protrusion mount on which the light emitting element is mounted;
   a phosphor layer around the mount; and
   a filler containing layer provided on the phosphor layer around the mount.

10. The light emitting device according to claim 9, wherein the resin layer and the filler containing layer contain the same resin.

11. A light emitting device comprising:
    a light emitting element; and
    a phosphor layer adapted to absorb at least a part of light emitted from the light emitting element and emit a light having a different wavelength from that of the absorbed light,
    wherein a resin layer is formed on a light emitting face of the light emitting element such that a peripheral edge of the resin layer substantially conforms to a peripheral edge of the light emitting face and such that an upper surface of the resin layer is a curved surface,
    wherein the phosphor layer is formed along the upper surface of the resin layer, and
    wherein the light emitting device is configured to emit light consisting essentially of light emitted from the light emitting element and the light emitted from the phosphor layer.

12. The light emitting device according to claim 11, wherein the curved surface is defined based on a shape of the light emitting face of the light emitting element and surface tension of the resin before curing.

13. The light emitting device according to claim 11, further comprising:
    a substrate having a protrusion mount on which the light emitting element is mounted;
    a phosphor layer around the mount; and
    a filler containing layer provided on the phosphor layer around the mount.

14. The light emitting device according to claim 11, wherein the resin layer consists essentially of a translucent resin material.

15. The light emitting device according to claim 13, wherein the resin layer and the filler containing layer contain a same resin.

* * * * *